United States Patent [19]

Giesecke et al.

[11] Patent Number: 5,182,135

[45] Date of Patent: * Jan. 26, 1993

[54] PROCESS FOR IMPROVING THE ADHERENCY OF METALLIC COATINGS DEPOSITED WITHOUT CURRENT ON PLASTIC SURFACES

[75] Inventors: Henning Giesecke, Leverkusen; Gerhard D. Wolf, Dormagen; Hanns P. Müller, Odenthal; Ulrich von Gizycki; Martin Wienkenhöver, both of Leverkusen, all of Fed. Rep. of Germany

[73] Assignee: Bayer Aktiengesellschaft, Leverkusen, Fed. Rep. of Germany

[*] Notice: The portion of the term of this patent subsequent to Mar. 20, 2007 has been disclaimed.

[21] Appl. No.: 673,172

[22] Filed: Mar. 18, 1991

Related U.S. Application Data

[63] Continuation of Ser. No. 264,425, Oct. 31, 1988, abandoned, which is a continuation of Ser. No. 80,120, Jul. 31, 1987, abandoned.

[30] Foreign Application Priority Data

Aug. 12, 1986 [DE] Fed. Rep. of Germany ....... 3627256

[51] Int. Cl.$^5$ ............................................. C23C 26/00
[52] U.S. Cl. ...................................... 427/98; 427/304; 427/305; 427/306; 427/443.1; 106/1.21; 106/1.28
[58] Field of Search ................ 427/98, 304, 305, 306, 427/443.1; 106/1.21, 1.28

[56] References Cited

U.S. PATENT DOCUMENTS 3,546,009 12/1970 Schneble et al. .
3,928,670 12/1975 Brummett ........................... 427/98
4,368,281 1/1983 Brummett ........................... 427/98
4,469,714 9/1984 Wada et al. .
4,493,861 1/1985 Sirinyan ............................. 427/306
4,575,467 3/1986 Sirinyan et al. .
4,585,502 4/1986 Uozn .................................. 427/302
4,590,115 5/1986 Cassat ................................ 427/437
4,764,401 8/1988 Sirinyan ............................. 427/304
4,830,714 5/1989 Sirinyan ............................. 427/98
4,832,989 5/1989 Giesecke ............................ 427/306
4,910,045 3/1990 Giesecke ............................ 427/98
4,913,768 4/1990 Wolf .................................. 427/98

FOREIGN PATENT DOCUMENTS 1169720 6/1984 Canada .............................. 427/304
0125617 11/1984 European Pat. Off. .
0131195 1/1985 European Pat. Off. .

OTHER PUBLICATIONS

R. Cannizzaro, "Applications of Polyimide Materials in Electronic Circuitry", Solid State Technology, Nov. 1969, pp. 31–38.

Julius Grant, "Hackh's Chemical Dictionary", McGraw-Hill Book Co., 4th edition, p. 527.

Primary Examiner—Shrive Beck
Assistant Examiner—Vi Duong Dang
Attorney, Agent, or Firm—Sprung Horn Kramer & Woods

[57] ABSTRACT

Activator formulations which contain an aromatic polyurethane as binder are highly suitable for the preparation of non-metallic substrate surfaces for currentless metallization.

The metal coatings produced are distinguished by good adhesion.

6 Claims, No Drawings

PROCESS FOR IMPROVING THE ADHERENCY OF METALLIC COATINGS DEPOSITED WITHOUT CURRENT ON PLASTIC SURFACES

This application is a continuation of application Ser. No. 264,425, filed Oct. 31, 1988, now abandoned, which is a continuation of Ser. No. 080,120 filed Jul. 31, 1987, now abandoned.

It is generally known that, in order to produce adherent metallic coatings on substrate elements which are not electroconducting, an adhesion-promoting paint, preferably based on ABS polymers, is initially applied to the surface. However, the disadvantage of this pretreatment method is that the moulded articles coated with this paint coat have to be treated with a pickling agent before the actual metallization in order to roughen the surface (cf., for example, DE-A 1,958,839).

It has therefore already been proposed that non-metallic substrate surfaces be treated directly, without prior pickling, with activator solutions for currentless metallization which contain, as adhesion promoters, complicated mixtures of acrylonitrile/butadiene copolymers and, if appropriate, phenolic resins (cf., for example, U.S. Pat. Nos. 3,305,460 and 3,560,257).

However, this type of process has hitherto not been able to establish itself in industry since the adherency of the metallic coatings produced is inadequate and the adhesion-promoting polymers do not meet the high demands placed on the thermal and electrical properties, in particular in printed circuit board technology.

Although the process according to U.S. Pat. No. 4,368,281 produces better adherency compared to this, relatively large amounts of activator, namely 5–16% by weight, are required for this.

Surprisingly, it has now been found that highly adherent metallic coatings can be applied to plastic surfaces without the disadvantages mentioned if these surfaces are treated, without pickling, with a printing paste formulation which contains, as essential components,
a) 0.03–4.00% by weight of an organometallic noble metal compound as activator
b) 10–30% by weight of a polyurethane elastomer
c) 5–25 % by weight of a filler and
d) 40–90 % by weight of a halogen-free solvent having a flashpoint >21° C. and a boiling point >100° C., the sum of the percents by weights of components a), b), c) and d) being less than or equal to 100% by weight.

It is surprising that the formulations according to the invention cause adherent metallization, since adherent metallization is not achieved on surfaces which have been coated only with the binders according to the invention. Adherent chemical metallization is caused only by the use of the formulations according to the invention.

Preferred printing pastes contain 0.05–3% of component a) and 60–80% of component d).

The binders according to the invention are known from polyurethane chemistry. They are prepared, for example, by reacting esters and/or ethers with isocyanates.

For the preparation of a storage-stable formulation, it is advantageous to employ polyurethanes which no longer contain free isocyanate groups.

Linear, aromatic polyurethane elastomers, as prepared, for example, from butanediol polyadipate, neopentyl glycol and 4,4'-diphenylmethane diisocyanate, have proven particularly suitable.

In order to increase the adherency of the formulations according to the invention to the surfaces, it may also be necessary to add polyisocyanates or oligourethanes or polyurethanes which contain free isocyanate groups to the binders according to the invention. In this case, additives which contain free aliphatic isocyanate groups have proven particularly suitable.

The following may be mentioned as examples: Organic polyisocyanates as obtained, for example, according to EP-A-0,160,913. These are biuret polyisocyanates based on 1,6-diisocyanatohexane, isocyanate group-containing polyisocyanates based on 1-isocyanato-3,3,5-trimethyl-5-isocyanatomethyl-cyclohexane, and isocyanurate group-containing polyisocyanates based on mixtures of 1,6-diisocyanatohexane and 1-isocyanato-3,3,5-trimethyl-5-isocyanatomethylcyclohexane. Biuret group-containing polyisocyanates as are accessible, for example, according to DE-A 1,101,394 (=U.S. Pat. No. 3,124,605), U.S. Pat. No. 3,358,010 or European Patent Specification 3,505 (=U.S. Pat. No. 4,264,519). Uretdione and isocyanurate group-containing organic polyisocyanates as obtained, for example, according to the teaching of DE-A 1,954,093 (=GB 1,244,416) or according to EP 0,173,252.

When using polyurethane having free aromatic isocyanate groups or for storage stability reasons, it may be favourable to reversibly block the free isocyanate groups in a known fashion. Such processes are known from polyurethane chemistry.

Blocking agents which can be employed are, for example, phenols, caprolactam, $\beta$-dicarbonyl compounds such as acetoacetic esters and malonic esters, certain alcohols, oximes and triazoles.

Binders containing isocyanate groups which are not blocked should not be added to the formulations according to the invention until just before processing.

Suitable activators in the formulations according to the invention are organometallic compounds of subgroups 1 or 8 of the periodic system (in particular Pd, Pt, Au and Ag), as described, for example, in EP-A 34,485, 81,438 and 131,195. Organometallic compounds of palladium with olefins (dienes), with $\alpha,\beta$-unsaturated carbonyl compounds, with crown ethers and with nitriles are particularly suitable. Butadienepalladium dichloride, bisacetonitrilepalladium dichloride, (4-cyclohexene-1,2-dicarboxylic anhydride)palladium dichloride, (mesityl oxide)palladium chloride, 3-hepten-2-onepalladium chloride and 5-methyl-3-hexen-2-onepalladium chloride are very particularly suitable.

Of course, mixtures of these compounds can also be employed. They can be present in the formulations in dissolved or dispersed form. In this case, a solution can also be prepared by adding solubilizers, for example quaternary ammonium salts, such as tetrabutylammonium bromide. In the case of a dispersion of the activators, it must be ensured that particle sizes below 1 $\mu$m are achieved.

Besides the activators, fillers, binders and solvents, formulations contain, if appropriate, surfactants, levelling agents and/or dyestuffs.

Suitable solvents in the formulations according to the invention are substances which are known in printing and painting technology, such as aromatic and aliphatic hydrocarbons, for example toluene, xylene, benzine and glycerol; ketones, for example methyl ethyl ketone and cyclohexanone; esters, for example butyl acetate, dioctyl phthalate and butyl glycolate, glycol ethers, for example ethylene glycol monomethyl ether, diglyme and propylene glycol monomethyl ether; esters of glycol ethers, for example ethylene glycol acetate and propylene glycol monomethyl ether acetate; and diacetone alcohol. Of course, mixtures of these solvents and the blends thereof with other solvents can also be employed. Solvents having an evaporation number >25 (diethyl ether=1) are preferred.

Suitable fillers are auxiliaries which are known from printing or painting technology, such as pigments, disperse silica, clay minerals, carbon blacks and rheological additives.

The following may be mentioned as examples: Aerosils, $TiO_2$, talc, iron oxides, kieselghur, heavy spars, kaolins, quartz powder, smectites, colour blacks, graphites, zinc sulphides, chromium yellow, bronzes, organic pigments and chalk. Aerosils, heavy spars and $TiO_2$ are preferred.

The formulations according to the invention are generally prepared by mixing the components. To this purpose, the wet comminution machines which are conventional in paint and printing technology, such as compounders, attrition mills, cylinder mills, dissolvers, rotor-stator mills, ball mills and stirred ball mills are particularly suitable, besides simple stirring. Of course, the formulation components can also be incorporated in separate steps For example, the activator can first be dissolved or dispersed in the binders and solvents, and the fillers only incorporated then. Previous preparation of a paste of the fillers in the solvents under high shear forces is also a possible process variant.

Surfaces can be activated by applying the formulations according to the invention for the purpose of adherent metallization by chemical plating. The application generally takes place by processes which are known from paint or printing technology.

The following may be mentioned as examples: spraying, brushing, rolling, offset printing, screen printing, pelt printing and dipping.

Suitable substrates for the process according to the invention are glass, quartz, ceramics, enamel, paper, polyethylene, polypropylene, epoxy resins, polyesters, polycarbonates, nylons, polyimides, polyhydantoins, ABS plastics, silicones, polyvinyl halides and polyvinylidene fluoride in the form of plates, films, papers and mats. Particularly preferred are substrates as are employed in printed circuit board production, for example phenolic resin papers, glass fibre-reinforced epoxide plates, polyester and polyimide films and ceramics.

After application of the formulations according to the invention to the surface, the solvents are removed. This generally takes place by drying.

Drying can take place at different temperatures, for example between RT and 200° C., and at atmospheric pressure or alternatively in vacuo. The drying time can of course be varied considerably.

The surfaces thus produced must subsequently be activated by reduction. To this purpose, the reducing agents which are conventional in plating technology, such as, for example, formaldehyde, hypophosphites and boranes, can be used preferentially.

A particularly preferred embodiment when using the formulations according to the invention comprises that the reduction in the metallizing bath is carried out immediately using the reducing agent for the currentless metallization. This embodiment is particularly suitable for aminoborane-containing nickel baths or formalin-containing copper baths.

The surfaces activated using the formulations according to the invention can be metallized without current in a further process step. Suitable baths for this are, particularly those containing nickel, cobalt, iron, copper, silver, gold and palladium salts, or mixtures thereof. Such metallizing baths are known in currentless metallization technology.

The formulations according to the invention are particularly suitable for partial activation of surfaces, very particularly for the preparation of printed circuits, foil keyboards, pressure-sensitive mats and sensors by printing processes, in particular screen printing processes, and subsequent additive chemical metallization.

EXAMPLE 1

An unreactive polyurethane elastomer is prepared from butanediol polyadipate (MW 2,000), neopentyl glycol and 4,4-diphenylmethane diisocyanate.

| | |
|---|---|
| 100 parts by weight | of a 30% strength solution of this polyurethane in ethylene glycol ethyl ether acetate (vscosity at 25° C. 1,250 mPa.s) |
| 20 parts by weight | of a colour black (Printex ® V) |
| 2 parts by weight | of 3-hepten-2-onepalladium chloride and |
| 2 parts by weight | of diethylene glycol | are carefully mixed with one another or dispersed by means of a 3-cylinder mill.

The paste produced is coated through a screen onto a Tyvek paper surface, dried for 1 hour at 50° C. in a water-pump vacuum, and subsequently metallized in an aminoborane-containing nickel bath A coherent nickel coating is obtained. Adherency according to DIN 53 151: code value GT 3.

EXAMPLE 2

| | |
|---|---|
| 20 parts by weight | of a 30% strength solution of a polyurethane according to Example 1 in N-methylpyrrolidone: ethylene glycol ethyl ether acetate = 1:1 |
| 4 parts by weight | of a colour black (Printex ® V) |
| 2 parts by weight | of 5-methyl-3-hexan-2-onepalladium chloride and |
| 2 parts by weight | of dioctyl phthalate | are carefully mixed with one another or dispersed by means of a 3-cylinder mill.

The paste produced is printed through a screen onto a polyvinylidene difluoride film, and the print is subsequently dried for 2 hours at 100° C. in a water-pump vacuum. The print is then metallized in an aminoborane-containing nickel bath for 30 minutes. A coherent metal coating is obtained. Adherency according to DIN 53 151: code value GT 5.

EXAMPLE 3

| | |
|---|---|
| 20 parts by weight | of a 30% strength polyurethane solution according to Example 2 |
| 4 parts by weight | of Aerosil ® (200 m²/g according to BET) |
| 20 parts by weight | of ethylene glycol ethyl ether acetate |
| 4 parts by weight | of a commercially available urethane stoving resin based on isophorone diisocyanate/malonic ester blocked about |

| | |
|---|---|
| | 75% strength solution in ethyl glycol acetate/xylene 1:1, NCO content blocked about 10% |
| 1 part by weight | of 5-methyl-3-hexan-2-onepalladium | are carefully mixed or dispersed in the dissolver.

The paste produced is printed onto a PES film through a screen, and the print is dried for 1 hour at 250° C. The surface is subsequently prereduced for 5 minutes in a 1% strength alkaline aminoborane solution, rinsed and then copper-plated for 1 hour in a formalin-containing copper bath at 60° C. A coherent metal coating of thickness 2.8 μm is obtained. Adherency according to DIN 53 151: code value GT 3.

EXAMPLE 4

| | |
|---|---|
| 60 parts by weight | of a 30% strength polyurethane solution according to Example 2 |
| 1 parts by weight | of diacetonitrilepalladium dichloride |
| 5 parts by weight | of Aerosil ® (380 m$^2$/g according to BET) |
| 30 parts by weight | of glycol ethyl ether acetate |
| 1 parts by weight | of silicone oil M 100 | are carefully mixed or dispersed by means of a 3-cylinder mill and printed according to Example 3 and dried, and the surfaces are copper-plated. A coherent metal coating having an adherency according to DIN 53 494 of 36 N is obtained.

EXAMPLE 5

| | |
|---|---|
| 100 parts by weight | of a 30% strength polyurethane solution according to Example 1 |
| 9 parts by weight | of Aerosil ® (380 m$^2$/g according to BET) |
| 50 parts by weight | of glycol methyl ether acetate |
| 16 parts by weight | of a uretdione and isocyanurate group-containing polyisocyanate based on 1,6-diisocyanatohexane having an NCO content of 22.7% |
| 1.5 parts by weight | of (tetrahydrophthalic anhydride)palladium dichloride | are carefully mixed with one another in a compounder.

The paste produced is subsequently printed according to Example 3, and the print is copper-plated. A coherent metal coating is obtained. The adherency can no longer be determined exactly according to DIN 53 494 since the copper cannot be detached from the polyester film without damage.

EXAMPLE 6

| | |
|---|---|
| 650 parts by weight | of a 30% strength polyurethane solution according to Example 1 |
| 330 parts by weight | of glycol methyl ether acetate |
| 55 parts by weight | of Aerosil ® (380 m$^2$/g according to BET) |
| 52 parts by weight | of Helio true blue GO |
| 13 parts by weight | of butadienepalladium chloride | are carefully mixed or dispersed by means of a 3-cylinder mill and printed according to Example 3 onto a PES film. By currentless copper-plating of the print, a copper coating having an adherency according to DIN 53 494 of 21 N is obtained.

I claim:

1. A process for improving the adherency of metal coatings deposited without current on plastic surfaces by treating the latter with printing paste formulations which contain, as essential components,
   a) between about 0.03 to 4.00% by weight of an organometallic noble metal compound as activator,
   b) between about 10 to 30% by weight of an unreactive polyurethane elastomer as binder,
   c) between about 5 to 25% by weight of a filler, and
   d) between about 40 to 90% by weight of a halogen-free solvent having a flashpoint >21° C. and a boiling point >100° C.,
   the sum of the percents by weights of components a), b), c) and d) being less than or equal to 100% by weight.

2. Process according to claim 1, characterized in that the activators used are organometallic compounds of Pd, Pt, Ag or Au.

3. Process according to claim 1, characterized in that the polyurethane elastomers used are free of isocyanate groups.

4. Process according to claim 1, characterized in that, in addition, polyisocyanates or oligourethanes or polyurethanes containing free isocyanate groups are added to the formulations.

5. Process according to claim 1, characterized in that the formulations contain Aerosils, TiO$_2$ or heavy spars as activators.

6. A printing paste formulation useful for the production of printed circuits, foil keyboards, pressure-sensitive mats and sensors comprising, as essential components,
   a) between about 0.03 to 4.00% by weight of an organometallic noble metal compound as activator,
   b) between about 10 to 30% by weight of an unreactive polyurethane elastomer as binder,
   c) between about 5 to 25% by weight of a filler, and
   d) between about 40 to 90% by weight of a halogen-free solvent having a flashpoint >21° C. and a boiling point >100° C., the sum of the percents by weights of components a), b), c) and d) being less than or equal to 100% by weight.

* * * * *